(12) United States Patent
Park

(10) Patent No.: US 11,622,441 B2
(45) Date of Patent: Apr. 4, 2023

(54) ELECTRONIC DEVICE COMPRISING GROUND REINFORCEMENT STRUCTURE

(71) Applicant: Samsung Electronics Co., Ltd., Gyeonggi-do (KR)

(72) Inventor: Minki Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 35 days.

(21) Appl. No.: 17/282,467

(22) PCT Filed: Sep. 2, 2019

(86) PCT No.: PCT/KR2019/011234
§ 371 (c)(1),
(2) Date: Apr. 2, 2021

(87) PCT Pub. No.: WO2020/085639
PCT Pub. Date: Apr. 30, 2020

(65) Prior Publication Data
US 2021/0385941 A1 Dec. 9, 2021

(30) Foreign Application Priority Data
Oct. 26, 2018 (KR) .................. 10-2018-0129384

(51) Int. Cl.
*H05K 1/02* (2006.01)
*H01R 12/77* (2011.01)
*H05K 1/14* (2006.01)
*H05K 5/00* (2006.01)
*H05K 7/20* (2006.01)
*H05K 9/00* (2006.01)

(52) U.S. Cl.
CPC ......... *H05K 1/0215* (2013.01); *H01R 12/775* (2013.01); *H05K 1/0209* (2013.01);
(Continued)

(58) Field of Classification Search
CPC .. H05K 1/0215; H05K 1/0209; H05K 1/0203; H05K 1/14; H05K 7/20336;
(Continued)

(56) References Cited

U.S. PATENT DOCUMENTS 6,275,220 B1 * 8/2001 Nitta .................. H05K 7/20963
345/206
6,657,620 B2 * 12/2003 Oishi ................. H05K 7/20963
345/206
(Continued)

FOREIGN PATENT DOCUMENTS

JP 2012-23166 A 2/2012
KR 10-2002-0064416 A 8/2002
(Continued)

*Primary Examiner* — Paresh Paghadal
(74) *Attorney, Agent, or Firm* — Cha & Reiter, LLC

(57) ABSTRACT

An electronic device according to various embodiments of the disclosure may include: a housing which includes a first plate facing a first direction, a second plate facing a second direction opposite to the first direction, and a lateral member covering at least part of the space between the first and second plates; a display disposed to be visible in at least part of the first plate; a first circuit board which includes a first face facing the first direction and a second face facing the second direction, and which is disposed in the second direction of the display; a second circuit board which is disposed not to overlap at least in part with the first printed circuit board, and which is electrically coupled with the first circuit board; a socket mounted to the second circuit board; at least one or more metal structures disposed on the first circuit board to transfer, to another component, heat of at least one or more exothermic elements mounted on the first circuit board; and a ground path constructed in at least part of the second circuit board so as to be electrically coupled to the first circuit board or the metal member or the first circuit board and the metal structure.

8 Claims, 8 Drawing Sheets

(52) U.S. Cl.
CPC ............. *H05K 1/14* (2013.01); *H05K 5/0017* (2013.01); *H05K 7/20336* (2013.01); *H05K 9/0064* (2013.01); *H05K 2201/10128* (2013.01)

(58) Field of Classification Search
CPC ............. H05K 7/20445; H05K 5/0017; H05K 9/0064; H05K 2201/10128; H05K 2201/10522; H01R 12/775; H01R 13/648
See application file for complete search history.

(56) References Cited

U.S. PATENT DOCUMENTS

| | | | |
|---|---|---|---|
| 7,535,173 B2* | 5/2009 | Kim | .......................... H05K 5/02 445/24 |
| 8,514,362 B2* | 8/2013 | Kim | .................... G02F 1/13454 349/161 |
| 2009/0321111 A1 | 12/2009 | Wu | |
| 2015/0085903 A1* | 3/2015 | Gundel | .................... H05K 1/18 375/219 |
| 2016/0037623 A1 | 2/2016 | Fjelstad | |
| 2017/0289786 A1 | 10/2017 | Dishon et al. | |
| 2018/0287302 A1 | 10/2018 | Kim et al. | |
| 2018/0299929 A1 | 10/2018 | Kim et al. | |
| 2019/0107870 A1* | 4/2019 | Ali | .......................... G06F 1/203 |
| 2020/0365977 A1* | 11/2020 | Matsumaru | .......... H01Q 21/065 |

FOREIGN PATENT DOCUMENTS

| | | |
|---|---|---|
| KR | 10-2010-0125081 A | 11/2010 |
| KR | 10-2018-0109444 A | 10/2018 |
| KR | 10-2018-0115153 A | 10/2018 |

\* cited by examiner

ELECTRONIC DEVICE COMPRISING GROUND REINFORCEMENT STRUCTURE

CROSS REFERENCE TO RELATED APPLICATIONS

This application is a National Phase Entry of PCT International Application No. PCT/KR2019/011234, which was filed on Sep. 2, 2019, and claims a priority to Korean Patent Application No. 10-2018-0129384, which was filed on Oct. 26, 2018, the contents of which are incorporated herein by reference.

TECHNICAL FIELD

Various embodiments of the disclosure relate to a ground reinforcement structure of an electronic device.

BACKGROUND ART

An electronic device may include at least one or more sockets so as to be electrically coupled with an external device. In order for the external device accommodated in the socket to be electrically coupled to a main circuit board included in the electronic device, at least one or more auxiliary circuit boards may be disposed.

Among the auxiliary circuit boards, an auxiliary circuit board having a socket mounted thereon may be disposed around the main circuit board, and thus may be constructed to be electrically coupled to an electronic component, for example, an Application Processor (AP), mounted on the main circuit board by using one connector.

DISCLOSURE OF INVENTION

Technical Problem

However, since the auxiliary circuit board having the socket mounted thereon is constructed to be coupled to the main circuit board by using the connector, noise generated when a ground is not sufficiently secured may lead to a deterioration of Radiated Emission (RE) performance.

Various embodiments of the disclosure may provide an electronic device with improved RE performance, by constructing a ground reinforcement structure on a circuit board including a socket to reduce generation of an electromagnetic wave (e.g., a noise) emitting radioactivity.

According to various embodiments of the disclosure, in a circuit board including a socket, a ground path may be constructed on a main circuit board to suppress noise generation, thereby providing an electronic device with improved RE performance.

According to various embodiments of the disclosure, in a circuit board including a socket, a ground path may be constructed on a metal structure to suppress noise generation, thereby providing an electronic device with improved RE performance.

According to various embodiments of the disclosure, in a circuit board including a socket, a ground path may be constructed on a heat pipe assembly to suppress noise generation, thereby providing an electronic device with improved RE performance.

Solution to Problem

An electronic device according to various embodiments of the disclosure may include: a housing which includes a first plate facing a first direction, a second plate facing a second direction opposite to the first direction, and a lateral member covering at least part of the space between the first and second plates; a display disposed to be visible in at least part of the first plate; a first circuit board which includes a first face facing the first direction and a second face facing the second direction, and which is disposed in the second direction of the display; a second circuit board which is disposed not to overlap at least in part with the first printed circuit board, and which is electrically coupled with the first circuit board; a socket mounted to the second circuit board; at least one or more metal structures disposed on the first circuit board to transfer, to another component, heat of at least one or more exothermic elements mounted on the first circuit board; and a ground path constructed in at least part of the second circuit board so as to be electrically coupled to the first circuit board or the metal member or the first circuit board and the metal structure.

An electronic device according to various embodiments of the disclosure may include: a first circuit board which includes a first face facing a first direction and a second face facing a second direction opposite to the first direction; a second circuit board which is disposed not to overlap with the first circuit board, and which includes a first face facing the first direction and a 10 second face facing the second direction; a first ground path constructed in a first portion of the second circuit board so as to be coupled to the first circuit board; and a second ground path constructed in a second portion of the second circuit board spaced apart from the first portion so as to be thermally coupled with at least one or more shielding structures disposed on the first face of the first circuit board.

Advantageous Effects of Invention

An electronic device according to various embodiments of the disclosure constructs a ground reinforcement structure on a circuit board including a socket to suppress noise generation, thereby reliably securing Radiated Emission (RE) performance.

An electronic device according to various embodiments of the disclosure improves RE performance by approximately 9 dBm due to a first ground path, and improves RE performance by approximately 7.2 dBm due to a second ground path.

BEST MODE FOR CARRYING OUT THE INVENTION

Figure 1:
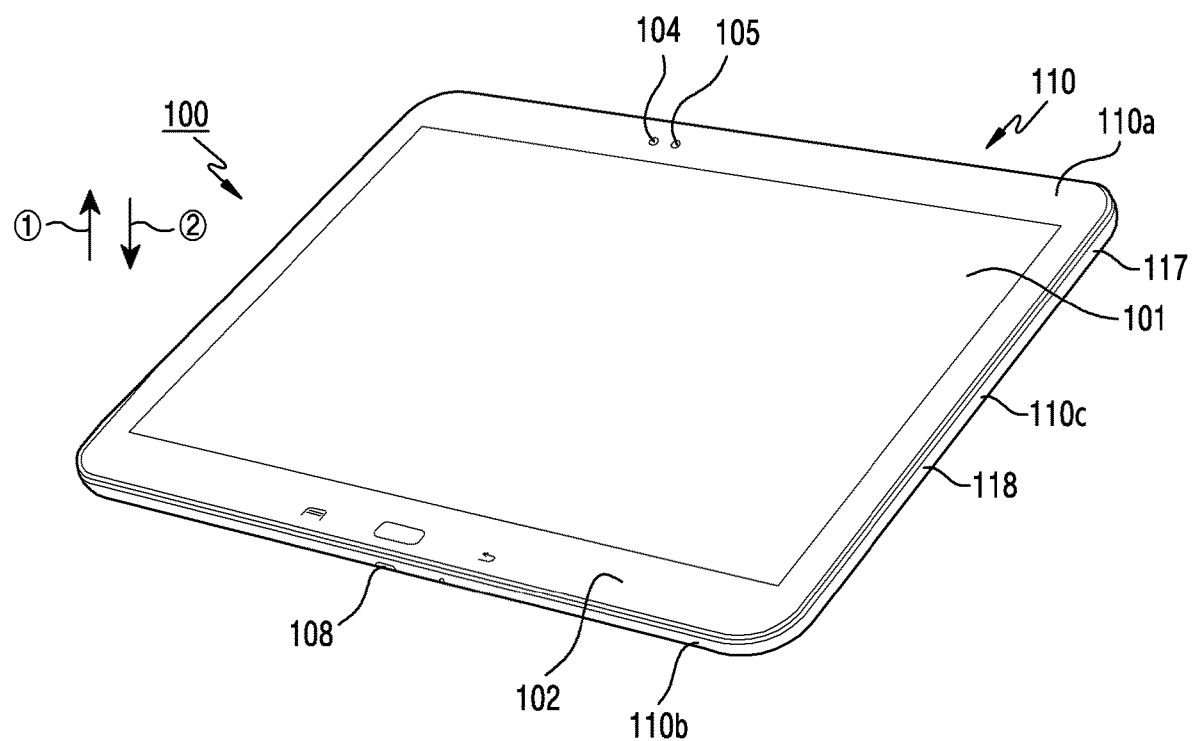
FIG. 1 is a front perspective view of an electronic device according to various embodiments of the disclosure.

Hereinafter, various embodiments of the disclosure are described with reference to the accompanying drawings. However, it should be appreciated that this is not intended to limit the technological features set forth herein to particular embodiments and include various changes, equivalents, or replacements for an embodiment of the disclosure. With regard to the description of the drawings, similar reference numerals may be used to refer to similar or related elements.

An electronic device according to various embodiments of the disclosure may include at least one of, for example, a smartphone, a tablet Personal Computer (PC), a mobile phone, a video phone, an e-book reader, a desktop PC, a laptop PC, a netbook computer, a workstation, a server, a Personal Digital Assistant (PDA), a Portable Multimedia Player (PMP), a MPEG-1 Audio Layer 3 (MP3) player, a mobile medical device, a camera, and a wearable device (e.g., smart glasses, a Head-Mounted Display (HMD), electronic clothes, an electronic bracelet, an electronic necklace, an electronic appcessory, an electronic tattoo, a smart mirror, or a smart watch).

Figure 2:
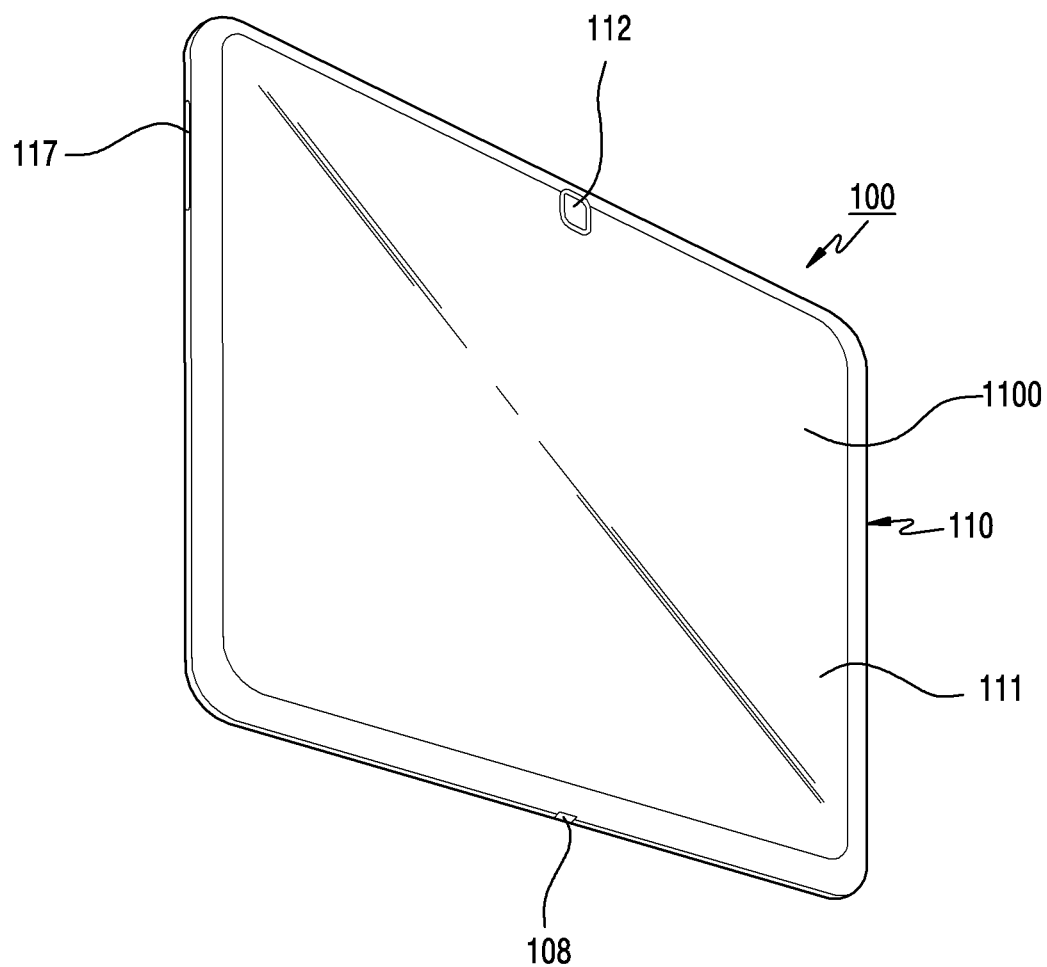
FIG. 2 is a rear perspective view of the electronic device of FIG. 1.

FIG. 1 is a front perspective view of an electronic device according to various embodiments of the disclosure. FIG. 2 is a rear perspective view of the electronic device of FIG. 1.

Referring to FIG. 1 and FIG. 2, an electronic device 100 according to an embodiment may include a housing 110 including a first face (or a front face) 110A, a second face (or a rear face) 110B, and a lateral face 110C surrounding a space between the first face 100A and the second face 110B. In another embodiment (not shown), the housing may refer to a construction which constitutes part of the first face 110A, second face 110B, and third face 110C of FIG. 1. According to an embodiment, the first face 110A may be constructed of a front plate 102 (e.g., a polymer plate or a glass plate having various coating layers) which is at least partially transparent in practice. The second face 110B may be constructed of a rear plate 111 which is opaque in practice. For example, the rear plate 111 may be constructed of coated or colored glass, ceramic, polymer, metallic materials (e.g. aluminum, stainless steel (STS), or magnesium) or a combination of at least two of the these materials. The lateral face 110C may be constructed of a lateral bezel structure (or a "lateral member") 118 bonded to the front plate 102 and the rear plate 111 and including metal and/or polymer. In some embodiments, the rear plate 111 and the lateral bezel structure 118 may be constructed integrally and may include the same material (e.g., a metallic material such as aluminum).

According to an embodiment, the electronic device 100 may include at least one or more of a display 101, a sensor module 104, camera modules 105 and 112, a key input device 117, a light emitting element 106, and connector holes 108 and 109.

The display 101 may be exposed through, for example, some portions of the front plate 102. In some embodiments, at least part of the display 101 may be exposed through the first face 110A and the front plate 102 constructing the first regions 110E of the lateral face 110C. In some embodiments, a corner of the display 101 may be constructed to be substantially the same as an outer boundary adjacent to the front plate 102. In another embodiment (not shown), in order to expand an area in which the display 101 is exposed, the display 110 and the front plate 102 may be constructed to have substantially the same interval between outer boundaries thereof.

The sensor module 104 may generate an electrical signal or data value corresponding to an internal operational state of the electronic device 100 or an external environmental state. For example, the sensor module may further include at least one of a gesture sensor, a gyro sensor, an atmospheric pressure sensor, a magnetic sensor, an accelerometer, a grip sensor, a color sensor, an Infrared (IR) sensor, a biometric sensor, a temperature sensor, a humidity sensor, and an illuminance sensor.

The camera modules 105 and 112 may include the first camera device 105 disposed to the first face 110A of the electronic device 100 and the second camera device 112 disposed to the second face 110B. The camera devices 105 and 112 may include one or a plurality of lenses, an image sensor, and/or an image signal processor. In some embodiments, two or more lenses (an infrared camera, wide angle and telephoto lenses) and image sensors may be disposed to one face of the electronic device 100.

The key input device 117 may be disposed to the lateral face 110C of the housing 110. In another embodiment, the electronic device 100 may not include the entirety or part of the aforementioned key input device 117. The key input device 117, which is not included, may be implemented on a display 101 in a different form such as a soft key or the like. In some embodiments, the key input device may include the sensor module 116 disposed to the second face 110B of the housing 110.

The connector hole 108 may include the first connector hole capable of accommodating a connector (e.g., a USB connector) for transmitting/receiving power and/or data of an external electronic device and/or the second connector hole (e.g., earphone jack) capable of accommodating a connector for transmitting/receiving an audio signal with respect to the external electronic device.

Figure 3:
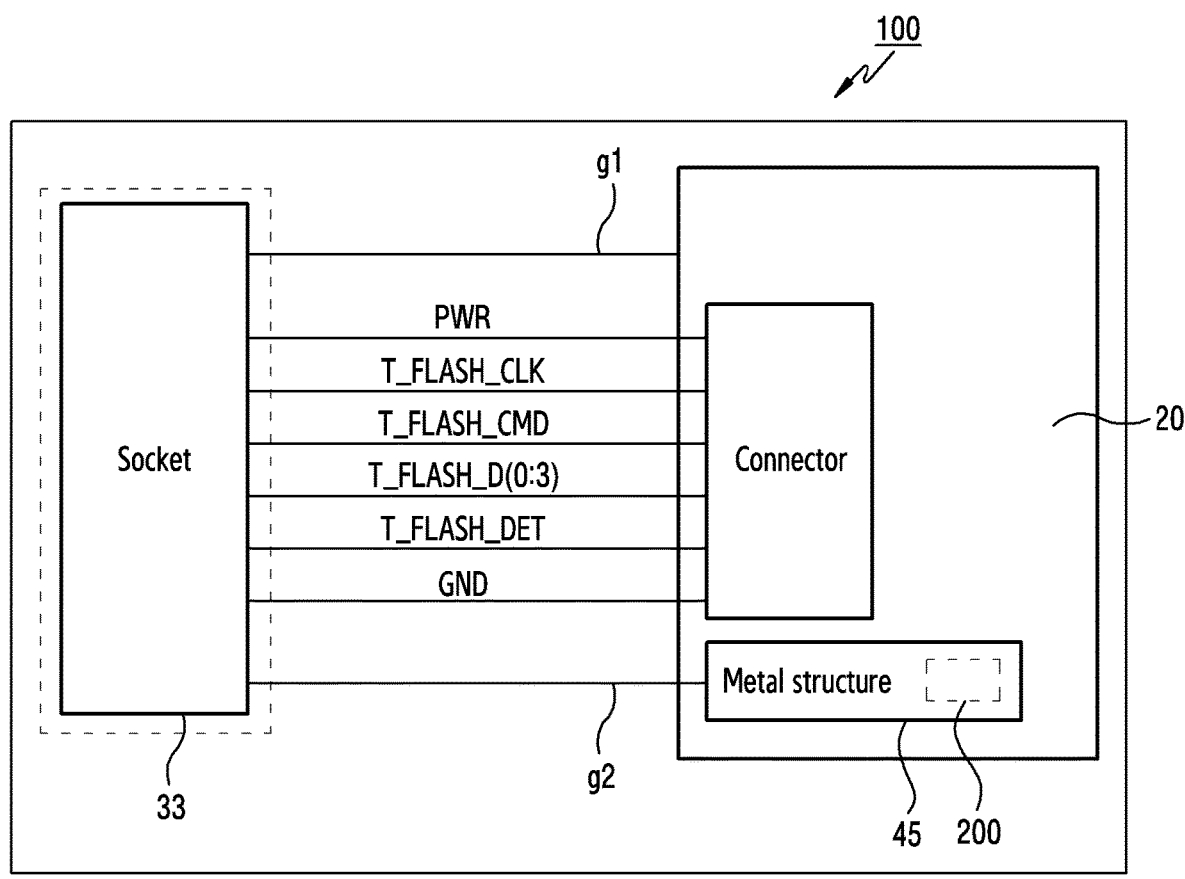
FIG. 3 is a block diagram briefly illustrating a ground reinforcement structure disposed to an electronic device according to various embodiments of the disclosure.

FIG. 3 is a block diagram briefly illustrating a ground reinforcement structure disposed to an electronic device according to various embodiments of the disclosure.

Referring to FIG. 3, an electronic device 100 according to various embodiments may include a first circuit board 20 and a second circuit board 30. According to an embodiment, at least one or more second circuit boards 30 may be disposed along the periphery of the first circuit board 20. The first circuit board 20 may be a main circuit board, and the second circuit board 30 may be an auxiliary circuit board. For example, the first circuit board 20 may be a circuit board constructed of a rigid material, and the second circuit board 30 may be a Secure Digital (SD) circuit board constructed of a flexible material on which the socket 33 is mounted.

According to an embodiment, the second circuit board 30 may be electrically coupled to the first circuit board 20 by means of a connector. According to an embodiment, the second circuit board 30 may be disposed to be close to a receiving unit of the electronic device 100, and may include at least one or more ground reinforcement structures for reliably securing RE performance.

According to an embodiment, the ground reinforcement structure may include at least one or more ground paths. According to an embodiment, the ground may include a first ground path g1 constructed in a first portion of the second circuit board 30 and electrically coupled to the first circuit board 20 and a second ground path g2 constructed in a second portion spaced apart from the first portion of the second circuit board 30 and electrically coupled to the metal structure 45. According to an embodiment, a metal structure 45 may be thermally coupled with an electronic component 200 (e.g., an Application Processor (AP)) disposed on the first circuit board 20.

Figure 4:
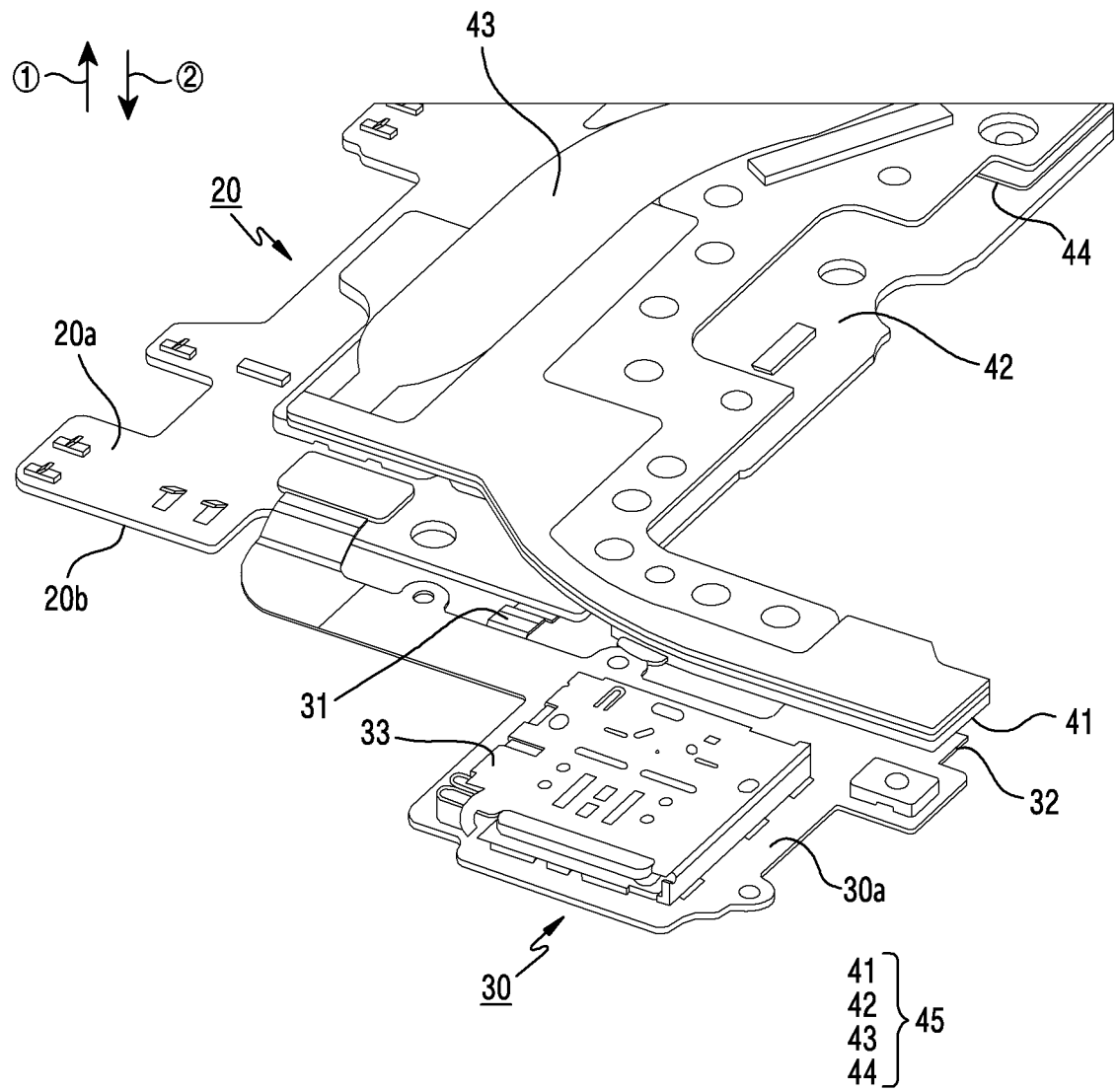
FIG. 4 and FIG. 5 are a perspective view illustrating a ground reinforcement structure and metal structure of a second circuit board according to various embodiments of the disclosure.
Figure 5:
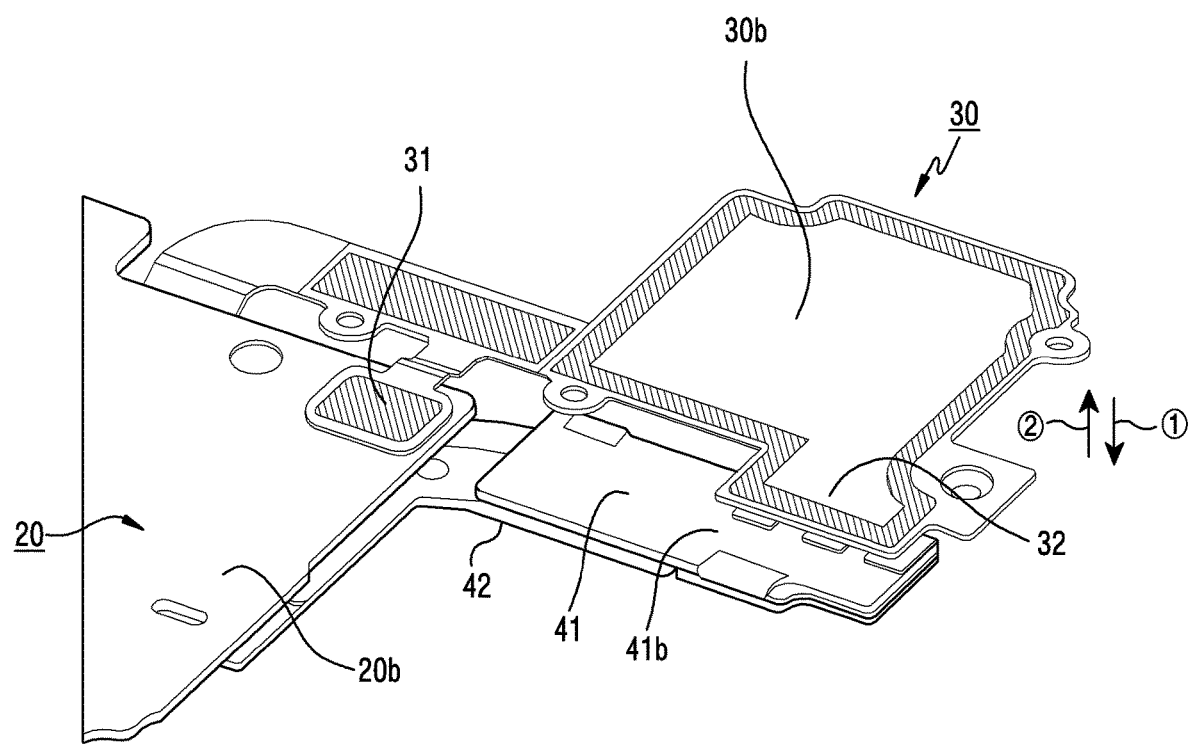
Figure 6:
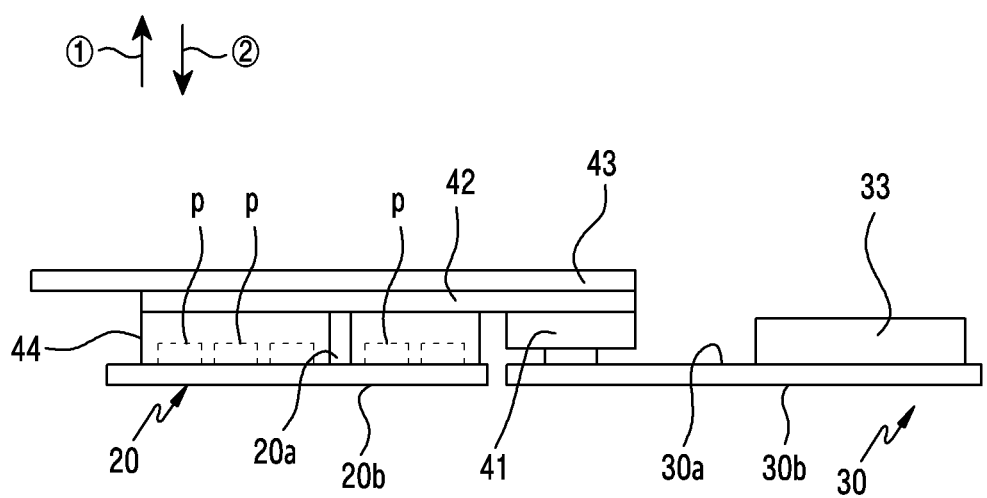
FIG. 6 briefly illustrates a stacked state between a ground reinforcement structure and metal structure of a second circuit board according to various embodiments of the disclosure.

FIG. 4 and FIG. 5 are perspective views illustrating a ground reinforcement structure and metal structure of a second circuit board according to various embodiments of the disclosure. FIG. 6 briefly illustrates a stacked state between a ground reinforcement structure and metal structure of a second circuit board according to various embodiments of the disclosure.

Referring to FIG. 4 to FIG. 6, an electronic device 100 according to various embodiments may include a first circuit board 20, a second circuit board 30, a socket 33, a metal structure 45, and at least one or more ground paths. According to an embodiment, the first circuit board 20 may include a first face 20a facing a first direction ① and a second face 20b facing a second direction ② opposite to the first direction ①. For example, the first face 20a of the first circuit board 20 may include various electronic components, for example, a memory, an Application Processor (AP), a Power Amplifying Module (PAM), or the like. The first circuit board 20 may be disposed in the second direction ② of a display. Although not shown, the first circuit board 20 may be supported by a support structure, for example, a bracket.

According to an embodiment, the at least one or more second circuit boards 30 may be disposed at a close location along the periphery of the first circuit board 20. The second circuit board 30 may include a first surface 30a facing the first direction ① and the second face 30b facing the second direction ②. According to an embodiment, the second circuit board 30 may be disposed not to overlap with the first circuit board 20, or may be disposed to overlap at least in part. The second circuit board 30 may be disposed to be close to a lateral member of the electronic device 100.

According to an embodiment, the socket 33 may be disposed to the first face 30a of the second circuit board 30. For example, the socket 33 may be a Secure Digital (SD) socket.

According to an embodiment, the metal structure 45 may include at least one or more metal members, as a portion to be coupled with the ground reinforcement structure of the second circuit board 30. According to an embodiment, the at least one or more metal members may be a heat transfer structure which transfers heat of at least one or more shielding structures 44 mounted on the first circuit board 20 to another component.

According to an embodiment, the at least one or more metal members may include a first metal member 41 coupled with a second ground path g2. The first metal member 41 may include a plate constructed of an aluminum material. According to an embodiment, the first metal member 41 may be thermally coupled with the shielding structure 44. The first metal member 41 may be thermally coupled with a second metal member 42. According to an embodiment, the first metal member 41 may be disposed to compensate for a step between the second circuit board 30, for example, the second ground path g2, and the second metal member 42.

According to an embodiment, the second metal member 42 may be thermally coupled with the shielding structure 44. For example, the second metal member 42 may be a plate constructed of a copper material.

According to an embodiment, the second metal member 42 may be thermally coupled with a heat pipe 43. According to an embodiment, the heat pipe 43 may be a heat transfer member or heat diffusion member for transferring heat of a plurality of exothermic elements p mounted on the first face 20a of the first circuit board 20 to a relatively low-temperature structure.

According to an embodiment, at least one or more ground paths may include a first ground path g1 constructed in a first portion 31 of the second circuit board 30 and electrically coupled to the first circuit board 20 and the second ground path g2 constructed in a second portion 32 spaced apart from the first portion of the second circuit board 30 and electrically coupled to the first metal structure 41.

According to an embodiment, the first ground path g1 may be bonded to the second face 20b of the first circuit board 20, and the second ground path g2 may be bonded to a face facing the second direction of the first metal member 41.

According to an embodiment, the first metal member 41 may be disposed to overlap at least in part with the second metal member 42. The second metal member 42 may be disposed to overlap at least in part with the heat pipe 43. The second metal member 42 may be disposed to overlap at least in part with the shielding structure 44.

Although not shown, a Thermal Interface Material (TIM) may be interposed between the first metal member 41 and the second metal member 42 or between the second metal member 42 and the shielding structure 44 or between the second metal member 42 and the heat pipe 43.

Figure 7:
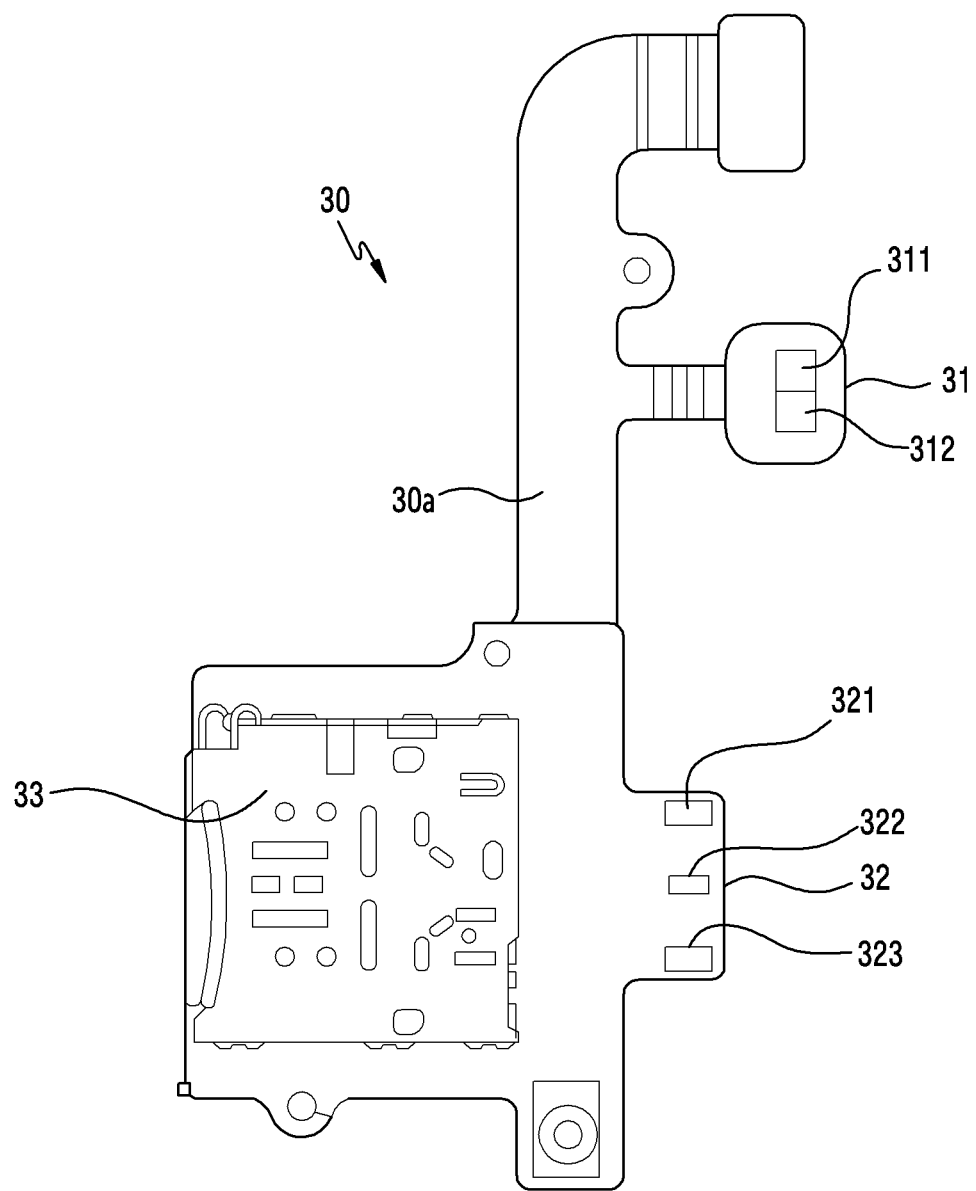
FIG. 7 is a plan view illustrating a second circuit board according to various embodiments of the disclosure.
Figure 8:
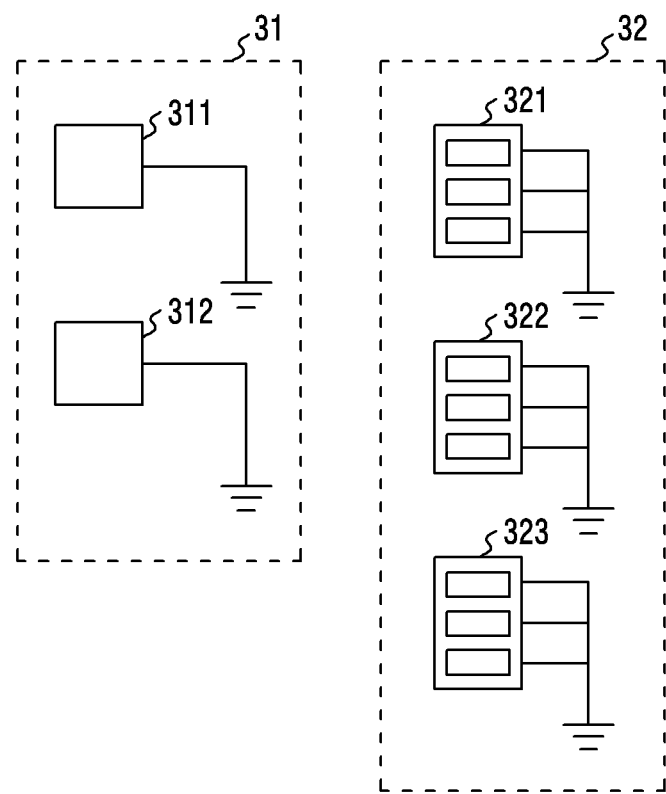
FIG. 8 is an exemplary diagram illustrating a state in which contact pads of first and second ground paths are grounded according to various embodiments of the disclosure.

FIG. 7 is a plan view illustrating a second circuit board according to various embodiments of the disclosure. FIG. 8 is an exemplary diagram illustrating a state in which contact pads of first and second ground paths are grounded according to various embodiments of the disclosure.

Referring to FIG. 7 and FIG. 8, a second circuit board 30 according to various embodiments may include a first portion 31 providing a first ground path (e.g., the first ground path g1 of FIG. 3) and a second portion 32 providing a second ground path (e.g., the second ground path g2 of FIG. 3).

According to an embodiment, the first portion 31 may include at least one or more contact pads 311 and 312 at an end portion so as to be connected with a first circuit board (e.g., the first circuit board 20 of FIG. 4). For example, the first and second contact pads 311 and 312 may be constructed on one face of the first portion 31 of the contact pad. According to an embodiment, the first contact pad 311 may be connected to the first circuit board to construct one ground path, and the second contact pad 312 may be connected to the first circuit board to construct one ground path.

According to an embodiment, the second portion 32 may have one or more contact pads 321, 322, and 323 constructed to be connected to a first metal member (e.g., the first metal member 41 of FIG. 4). For example, the contact pad may have first to third contact pads 321 to 323 constructed on one face of the second portion 32. According to an embodiment, the first contact pad 321 may be connected to the first metal member to construct one ground path, the second contact pad 322 may be connected to the first metal member to construct one ground path, and the third connection path 323 may be connected to the first metal member to construct one ground path. For example, at least one or more pads may be constructed on each of the first to third contact pads 321 to 323.

According to an embodiment of the disclosure, an electronic device (e.g., the electronic device 100 of FIG. 1) may include a housing (e.g., the housing 110 of FIG. 1) which includes a first plate (e.g., the first plate 102 of FIG. 1) facing a first direction (e.g., the first direction ① of FIG. 1), a second plate (e.g., the first plate 111 of FIG. 2) facing a second direction (e.g., the second direction ② of FIG. 1) opposite to the first direction, and a lateral member (e.g., the lateral member 117 of FIG. 1) covering at least part of the space between the first and second plates, a display disposed to be visible in at least part of the first plate, a first circuit board (e.g., the first circuit board 20 of FIG. 4) which includes a first face (e.g., the first face 20*a* of FIG. 6) facing the first direction and a second face (e.g., the second face 20*b* of FIG. 6) facing the second direction, and which is disposed in the second direction of the display, a second circuit board (e.g., the second circuit board 30 of FIG. 4) which is disposed not to overlap at least in part with the first circuit board (e.g., the first circuit board 20 of FIG. 4) and is disposed to be close to the lateral member, and which is electrically coupled with the first circuit board, a socket (e.g., the socket 33 of FIG. 3) mounted to the second circuit board 30, at least one or more metal structures (e.g., the metal structure 45 of FIG. 3) disposed on the first circuit board (e.g., the first circuit board 20 of FIG. 4) to transfer, to another component, heat of at least one or more exothermic elements mounted on the first circuit board (e.g., the first circuit board 20 of FIG. 4), and a ground path (e.g., the first and second ground paths g1 and g2 of FIG. 3) constructed in at least part of the second circuit board (e.g., the second circuit board 30) so as to be electrically coupled to the first circuit board (e.g., the first circuit board 30 of FIG. 4) or the metal member or the first circuit board (e.g., the first circuit board 20 of FIG. 4) and the metal structure 45.

According to an embodiment of the disclosure, the first circuit board (e.g., the first circuit board 20 of FIG. 4) may include a main circuit board constructed of a rigid material, and the second circuit board 30 may include a circuit board for an SD socket constructed of a flexible material.

According to an embodiment of the disclosure, the ground path may include a first ground path (e.g., the first ground path g1 of FIG. 3) constructed in a first portion 31 of the second circuit board 30, and coupled to the first circuit board (e.g., the first circuit board 20 of FIG. 4), and a second ground path (e.g., the second ground path g2 of FIG. 3) constructed in a second portion 32 spaced apart from the first portion of the second circuit board (e.g., the second circuit board 30 of FIG. 4), and coupled to the metal structure 45.

According to an embodiment of the disclosure, the first ground path g1 may be bonded to a second face b of the first circuit board (e.g., the first circuit board 20 of FIG. 4), and the second ground path g2 may be bonded to a face facing a second direction of the metal structure 45.

According to an embodiment of the disclosure, the metal structure 45 may include a first metal member (e.g., the first metal member 41 of FIG. 4), and the first metal member 41 may be thermally coupled with the second metal member (e.g., the second metal member 42 of FIG. 4), as a plate constructed of an aluminum material.

According to an embodiment of the disclosure, the first metal member (e.g., the first metal member 41 of FIG. 4) may be disposed to compensate for a step between the second circuit board (e.g., the second circuit board 30 of FIG. 4) and the second metal member 42.

According to an embodiment of the disclosure, the first metal member (e.g., the first metal member 41 of FIG. 4) may be thermally coupled with a heat pipe (e.g., the heat pipe 43 of FIG. 4).

According to an embodiment of the disclosure, the second metal member (e.g., the second metal member 42 of FIG. 4) may be thermally coupled with the heat pipe 43 to transfer heat to the heat pipe 43, as a plate constructed of a copper material.

According to an embodiment of the disclosure, the first metal member 41 may be thermally coupled with a shielding structure (e.g., the shielding structure 44 of FIG. 6) disposed on the first circuit board (e.g., the first circuit board 20 of FIG. 4).

According to an embodiment of the disclosure, the first metal member (e.g., the first metal member 41 of FIG. 4) may be thermally coupled with an exothermic element (e.g., the exothermic element p of FIG. 6) disposed on the first circuit board (e.g., the first circuit board 20 of FIG. 4).

According to an embodiment of the disclosure, an electronic device (e.g., the electronic device 100 of FIG. 1) may include: a first circuit board (e.g., the first circuit board 20 of FIG. 4) which includes a first face a facing a first direction (e.g., the first direction ① of FIG. 1) and a second face b facing a second direction (e.g., the second direction ② of FIG. 1) opposite to the first direction; a second circuit board 30 which is disposed not to overlap with the first circuit board (e.g., the first circuit board 20 of FIG. 4), and which includes a first face a facing the first direction and a second face b facing the second direction; a first ground path (e.g., the first ground path g1 of FIG. 3) constructed in a first portion 31 of the second circuit board 30 so as to be coupled to the first circuit board (e.g., the first circuit board 20 of FIG. 4); and a second ground path (e.g., the second ground path g2 of FIG. 3) constructed in a second portion 32 of the second circuit board 30 spaced apart from the first portion 31 so as to be thermally coupled with at least one or more shielding structures 44 disposed on the first face a of the first circuit board (e.g., the first circuit board 20 of FIG. 4).

According to an embodiment of the disclosure, at least one or more metal members may be disposed between the second ground path (e.g., the second ground path g2 of FIG. 3) and the shielding structure (e.g., the shielding structure 44 of FIG. 6) to transfer heat.

According to an embodiment of the disclosure, the metal member may include: a first metal member (e.g., the first metal member 41 of FIG. 4) in contact with the second ground path (g2) and a second metal member (e.g., the second metal member 42 of FIG. 4) disposed in contact with at least part of the first metal member 41, and thermally coupled with the shielding structure 44.

According to an embodiment of the disclosure, the first metal member (e.g., the first metal member 41 of FIG. 4) may be disposed to compensate for a step between the second circuit board 30 and the second metal member 42.

According to an embodiment of the disclosure, the first metal member (e.g., the first metal member 41 of FIG. 4) and the second metal member (e.g., the second metal member 42 of FIG. 4) may be disposed in a stacked structure in a state of overlapping at least in part.

Various embodiments of the disclosure disclosed in the specification and the drawing are merely a specific example presented for clarity and are not intended to limit the scope of the embodiments of the disclosure. Therefore, in addition to the embodiments disclosed herein, various changes in forms and details made without departing from the technical concept of the various embodiments of the disclosure will be construed as being included in the scope of the various embodiments of the disclosure.

The invention claimed is:

1. An electronic device comprising:
    a housing which includes a first plate, a second plate facing the first plate, and a lateral member covering at least part of a space between the first plate and second plates;
    a display disposed to be visible in at least part of the first plate;
    a first circuit board which includes a first face facing the first plate and a second face facing the second plate;
    a second circuit board which is disposed not to overlap at least in part with the first circuit board, and which is electrically coupled with the first circuit board;
    a socket mounted to the second circuit board;
    at least one or more metal structures disposed on the first circuit board to transfer, to another component, heat of at least one or more exothermic elements mounted on the first circuit board; and
    a ground path constructed in at least part of the second circuit board so as to be electrically coupled to the first circuit board or the at least one or more metal structures or the first circuit board and the at least one or more metal structures,
    wherein the at least one or more metal structures includes a first metal member, and the first metal member is thermally coupled with a second metal member, as a plate constructed of an aluminum material,
    wherein the first metal member is disposed to compensate for a step between the second circuit board and the second metal member.

2. The electronic device of claim 1, wherein the first circuit board includes a main circuit board constructed of a rigid material, and the second circuit board includes a circuit board for a Secure Digital (SD) socket constructed of a flexible material.

3. The electronic device of claim 2, wherein the ground path includes:
    a first ground path constructed in a first portion of the second circuit board, and coupled to the first circuit board; and
    a second ground path constructed in a second portion spaced apart from the first portion of the second circuit board, and coupled to the metal structure.

4. The electronic device of claim 3, wherein the first ground path is bonded to a second face of the first circuit board, and the second ground path is bonded to a face facing a second direction of the at least one or more metal structures.

5. The electronic device of claim 1, wherein the first metal member is thermally coupled with a heat pipe.

6. The electronic device of claim 5, wherein the second metal member is thermally coupled with the heat pipe to transfer heat to the heat pipe, as a plate constructed of a copper material.

7. The electronic device of claim 1, wherein the first metal member is thermally coupled with a shielding structure disposed on the first circuit board.

8. The electronic device of claim 1, wherein the first metal member is thermally coupled with an exothermic element disposed on the first circuit board.

* * * * *